(12) United States Patent
Jin et al.

(10) Patent No.: US 6,205,264 B1
(45) Date of Patent: Mar. 20, 2001

(54) OPTICAL ASSEMBLY WITH IMPROVED DIMENSIONAL STABILITY

(75) Inventors: Sungho Jin, Millington; Hareesh Mavoori, Berkeley Heights, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/059,858

(22) Filed: Apr. 14, 1998

(51) Int. Cl.[7] ..................................................... G02B 6/12
(52) U.S. Cl. ........................... 385/14; 427/180; 428/614; 438/613
(58) Field of Search ........................... 427/180; 438/613; 428/614; 385/14

(56) References Cited

U.S. PATENT DOCUMENTS

| | | | |
|---|---|---|---|
| 4,738,389 | * | 4/1988 | Moshier et al. ..................... 228/198 |
| 4,901,325 | * | 2/1990 | Kato et al. ............................. 372/44 |
| 5,346,775 | * | 9/1994 | Jin et al. .............................. 428/614 |
| 5,548,677 | * | 8/1996 | Kakii et al. ........................... 385/92 |

OTHER PUBLICATIONS

S. Jin, Deformation–Induced Anisotropic Cr–Co–Fe Permanent Magnet Alloys, IEEE Transactions on Magnetics, vol. MAG–15, No. 6, Nov. 1979, pp. 1748–1750.

* cited by examiner

*Primary Examiner*—John D. Lee
*Assistant Examiner*—Ellen Kim
(74) *Attorney, Agent, or Firm*—Mathews, Collins, Shepherd & Gould, P.A.

(57) ABSTRACT

Aligned Optoelectronic assembly with improved dimensional stability is disclosed. The assembly is carried out with a bonding material, either a solder or an adhesive, which contain insoluble, non-coarsening dispersoid particles. New solder compositions having enhanced mechanical properties are described. Relatively inert particles having a diameter of 5000 nm or less are dispersed in a solder material having an average grain size of approximately 10,000 nm or less to produce such solder compositions. The dispersed particles act as physical barriers in solders substantially impeding the motion of grain boundaries and inhibiting grain growth during thermal and stress cycling which substantially inhibits coarsening. As a consequence, the optoelectronic device assembly according to the invention exhibit substantially improved dimensional stability, with the rate of creep deformation at the joint reduced by a factor of at least two.

26 Claims, 14 Drawing Sheets

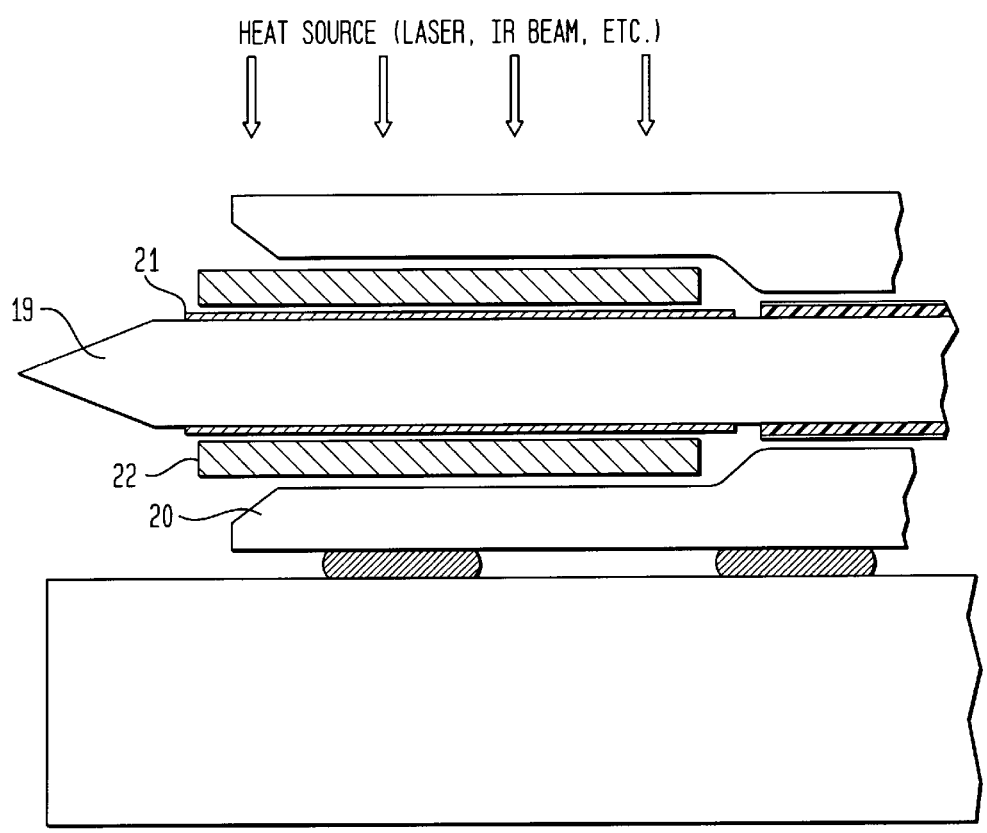

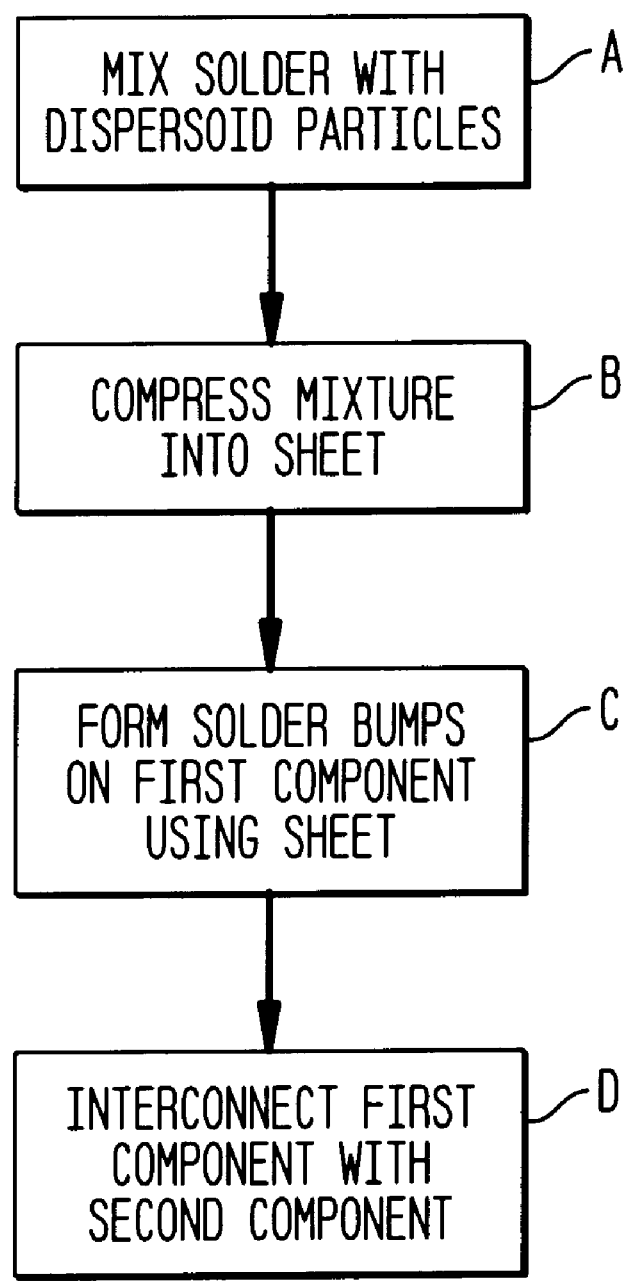

FIG. 9
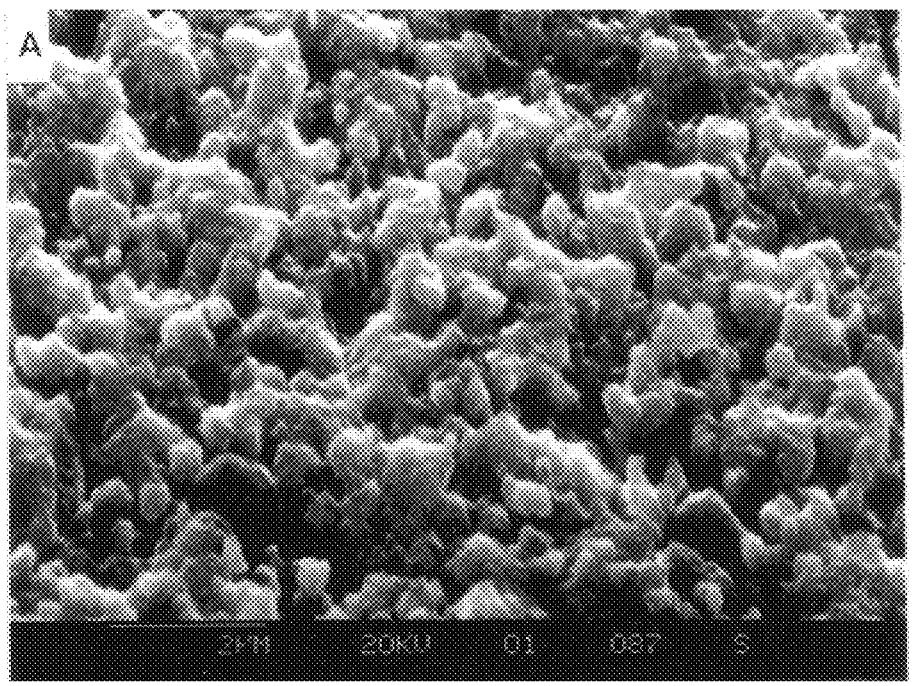
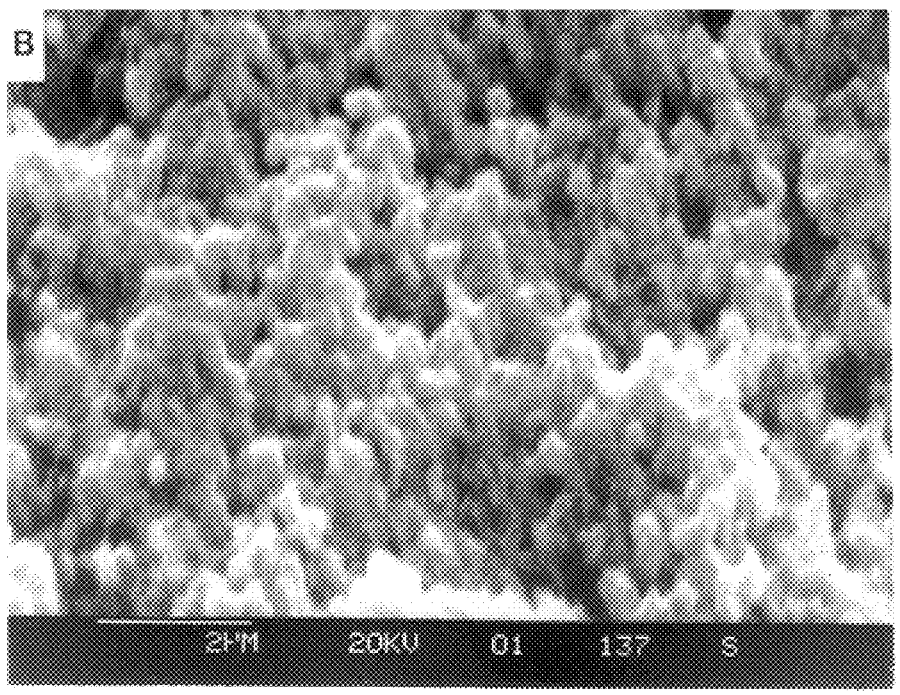

OPTICAL ASSEMBLY WITH IMPROVED DIMENSIONAL STABILITY

FIELD OF THE INVENTION

This invention pertains to optical assemblies with improved dimensional stability of optical alignment and, in particular, to an optical assembly comprising creep resistant solder or adhesive connections.

BACKGROUND OF THE INVENTION

In order for optoelectronics technology to have wide applications in consumer and telecommunication products, it is desirable to reduce the assembly cost and to improve the reliability of the products. One of the challenges for optical packaging is to connect the components with precision alignment and to maintain the stability of the alignment during device operation with fluctuations in ambient temperature and stress at the interconnect.

Precision alignments are necessary for coupling optical fibers or waveguides to optically active devices such as lasers, light-emitting diodes (LEDs), or photodetectors, and to passive devices such as other fibers. At present, such coupling is usually accomplished by active alignment, i.e., by monitoring the levels of output light intensity for different coupling conditions, and then forming a permanent assembly by soldering, brazing or adhesive bonding. While more accurate alignment is possible, such active alignment, often carried out on one or a few devices at a time, is time-consuming and costly.

For low-cost optical assembly, passive alignment using solder bonding is attractive. The optical monitoring is omitted, and a reasonably accurate device assembly can be achieved by utilizing the well-known solder self-alignment process or by using a convenient alignment fixture such as a substrate with V-grooves.

Reducing creep in bonds and joints is of paramount importance in optical packaging because of the need for maintaining positional accuracy of the components over extended periods of time. Creep is a permanent dimensional change from prolonged stress or exposure to elevated temperature. In lightguide ocean cables and many other optical assemblies, optical fiber is attached in aligned position with solder. Creep can destroy the alignment and coupling efficiency to and from the fiber.

Time and temperature dependent processes such as creep and stress relaxation become significant and affect the dimensions and properties of a material at high homologous temperatures ($T/T_{mp}$, where $T$ and $T_{mp}$ are the operating temperature and the melting point in absolute units respectively). These processes are important for the commonly used low temperature solders, which typically have melting points less than 200° C., since even room temperature corresponds to a homologous temperature of greater than 0.6. For applications requiring creep resistant joints (e.g. for multimode optical fiber interconnections with an alignment position tolerance of about 5–10 μm, or for single-mode optical interconnections with a tolerance of 1 μm), higher melting temperature solders such as the 80 Au-20 Sn eutectic (melting point of 278° C.) are used because of their well known creep resistance. However, high soldering temperatures can degrade the properties of optical fiber and other electronic components. Thus it is highly desirable to have a solder that has a low melting point in combination with a high creep resistance. A high mechanical strength is also helpful to prevent component misalignment during handling.

From the manufacturing point of view, low bonding and assembly temperatures are desirable for the ease of processing and the low cost for optoelectronic assembly as well as to minimize the possible damages to devices upon high temperature exposure. Therefore there is a need for a low melting temperature solders or low curing temperature adhesives which have substantially improved creep resistance so that the stability of optoelectronic assembly is assured.

SUMMARY OF THE INVENTION

In accordance with the invention, an optical assembly with improved dimensional stability comprises components bonded with a solder or adhesive containing insoluble, non-coarsening dispersoid particles having a diameter of 5000 nm or less. In solder, the particles are preferably dispersed in a solder material having an average grain size of approximately 10,000 nm or less. The dispersoid particles in solder act as physical barriers substantially impeding the motion of grain boundaries and inhibiting grain growth during thermal and stress cycling. This, in turn, substantially inhibits coarsening. The result is an assembly with substantially improved dimensional stability, with the rate of creep deformation at least halved.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIGS. 1A and 1B are schematic illustrations of exemplary optical assemblies according to the invention, FIG. 2 is a flow diagram illustrating an exemplary method for forming dispersoid-containing solder joints for the devices of FIG. 1;

FIGS. 9A and 9B are micrographs of a dispersoid-containing solder composition.

It is to be understood that these drawings are for purposes illustrating the concepts of the invention and are not to scale.

DETAILED DESCRIPTION

Applicants have determined that homogenous dispersions of particles of uniform size can provide creep resistance by impeding grain boundary sliding and pinning dislocations. To be effective obstacles to dislocation motion, the particles are preferably stable with respect to size (non-coarsening) and inter-particle spacing, have a higher flow resistance than the matrix and ideally are undeformable and resistant to fracture. For maximum dimensional stability the dispersoid particles advantageously have minimum diffusivity, interfacial energy and solubility in the matrix. Oxide particles are well suited.

The invention is embodied in optical assemblies that comprise the new solder composition or adhesive compositions that possess enhanced mechanical properties, especially creep resistant properties. Such assemblies include optoelectronic devices, waveguides and optical fibers bonded, as to a support element, by a dispersoid-containing solder or adhesive.

A solder composition useful for optical assemblies includes dispersoid particles having an average diameter in the range 5 nm to 5000 nm dispersed within a solder material having an average grain diameter of less than 10,000 nm and preferably less than 5000 nm. In such a composition, the dispersoid particles act as physical barriers substantially impeding the motion of grain boundaries and inhibiting grain growth. As a consequence, undesirable coarsening and microstructural changes during thermal and stress cycling is substantially inhibited. Moreover, the resulting solder composition is substantially resistant to creep-induced dimensional changes and device misalignment.

The dispersoid particles should be substantially inert with minimal liquid-solubility or solid-solubility in the solder material in order for the particles to advantageously retain their fine dimension and not to coarsen during device service. The use of Pb—Sn solders in the following discussion is for illustration purposes only and is not meant to be a limitation of the invention. It is possible to use lead-free solders for the solder materials including, for example, Sn—Ag, Sn—Sb, Bi—Sn, Au—Sn, Sn—In and In—Ag based eutectic and noneutectic solders as well as elemental solder materials such as Sn or In. It is also possible to include dispersoid particles in adhesives such as epoxy and thereby reduce creep. Accordingly, numerous different types of bonding materials and dispersoid particles are useable in accordance with the invention.

Figure 1A:
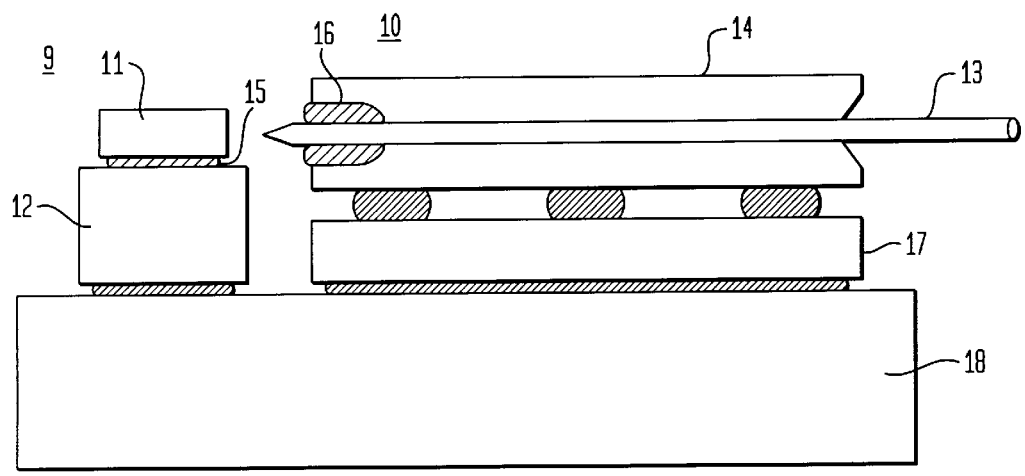

Referring to the drawings, FIG. 1A schematically illustrates exemplary optical assemblies in accordance with the invention. Each assembly 9, 10 comprises an optical element bonded to a support element. In assembly 9, the optical element is a laser 11 and the support element can be a heat spreader 12. In assembly 10, the optical element is an optical fiber 13 and the support element is a cylindrical Kovar sleeve 14. The solder joints 15, 16 which position the laser and the optical fiber after their alignment are made up of creep resistant bonding materials. The laser 11 is mounted on a heat spreader 12 such as BeO, diamond or SiC for thermal management while the fiber 13 is placed in a tube-shape sleeve 14 of Kovar alloy (Fe—Ni—Co alloy). The support elements, in turn, can be mounted on other stand-offs e.g. 17 and substrates e.g. 18. Alternatively, instead of mounting on a flat substrate, the optical assembly can be a co-axial arrangement of mating laser and the optical fiber.

Figure 3A:
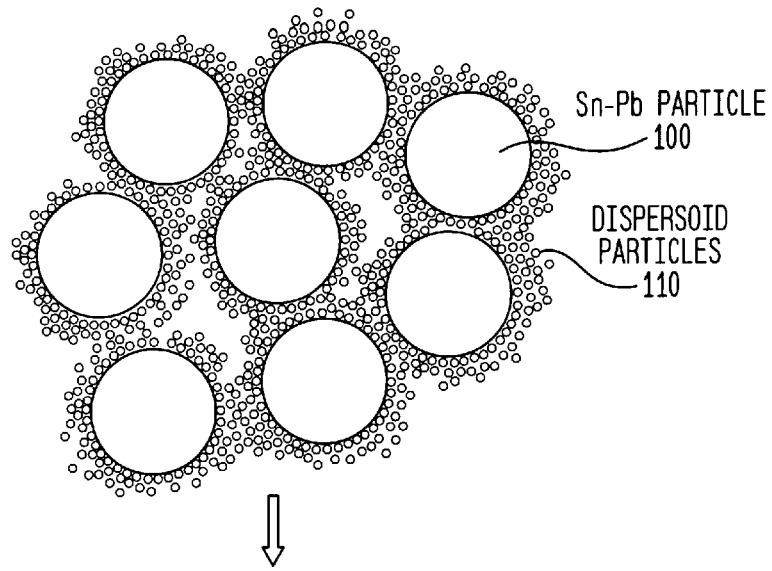
FIGS. 3A, 3B and 3C are schematic diagrams illustrating solder material and dispersoid interaction during the method of FIG. 2.

FIG. 2 shows an exemplary process for forming an optical assembly using dispersoid-containing bonding material. In the process, a solder powder such as Pb—Sn powder is mixed with dispersoid particles in step A. FIG. 3A provides a representation of resulting mixture with the solder powder and dispersoid particles identified with reference numbers 100 and 110, respectively.

Figure 3B:
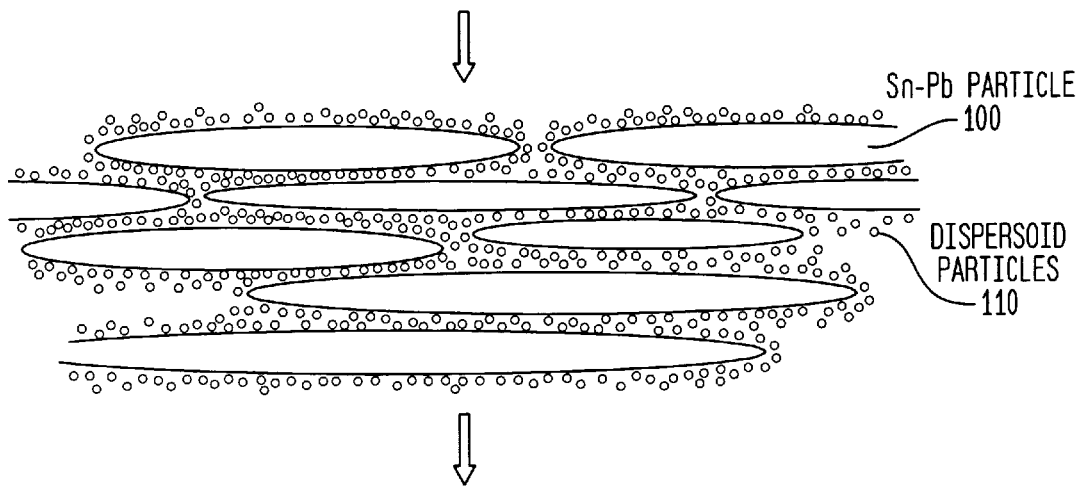
Figure 3C:
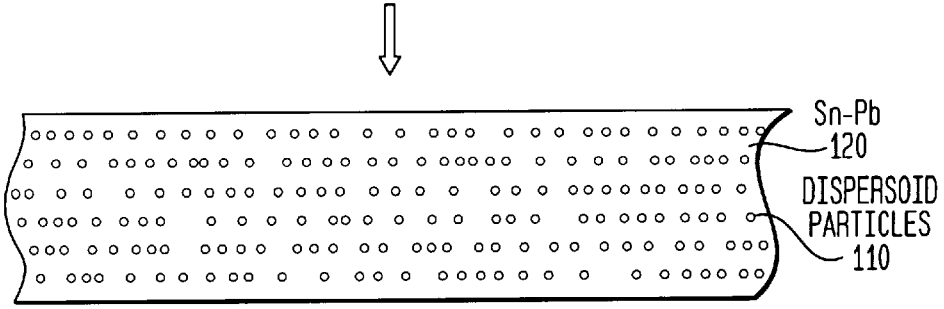

In step B of FIG. 2, the mixed composition is mechanically compressed. This achieves plastic deformation of the solder particles 100 as shown in FIG. 3B to produce a resulting sheet 120 of the solder composition, as shown in FIG. 3C.

Figure 5:
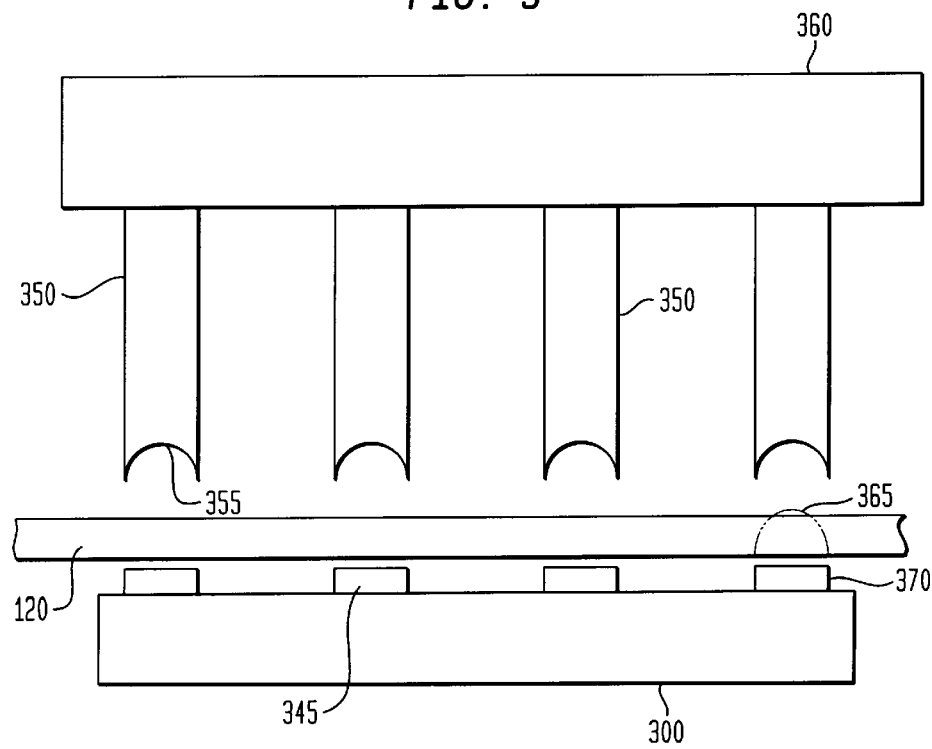
FIG. 5 is a schematic diagram illustrating an alternative method for forming solder bumps.
Figure 6:
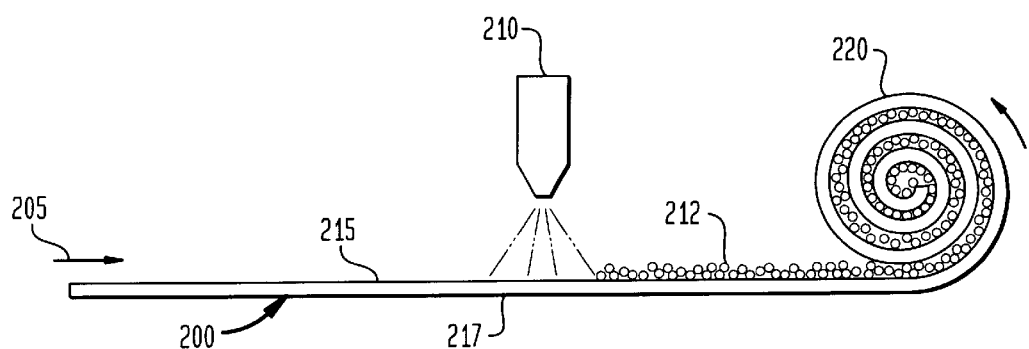
FIG. 6 is a schematic diagram illustrating an alternative method for forming the dispersoid-containing solder.

The solder composition sheet 120 is then used, in step C of FIG. 2 to form solder bumps 130 on a first component 140, shown in FIGS. 5 and 6. Suitable methods for forming such solder bumps 130 are described in greater detail below.

Figure 8:
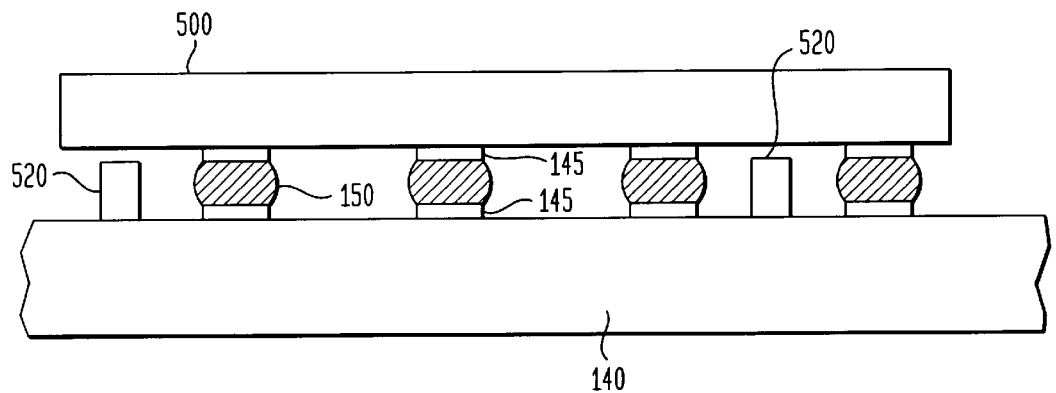
FIG. 8 is a schematic diagram illustrating an optical assembly made using interconnect spacers.

In step D of FIG. 2, a solder joint is formed between the first component and a second component (see, e.g. joint 150 in FIG. 8). The first or the second component in the optical assembly can be a laser chip, a light emitting diode (LED), a photodetector, a liquid crystal device, or a waveguide or fiber.

Instead of forming solder bumps on the first device component and later solder bonding it onto the second device component, the soldering assembly can be carried out in a single step utilizing solder preforms. FIG. 1B illustrates an assembly soldered in a single step compromising a metallized fiber 19 bonded to a positioning substrate 20.

To make the FIG. 1B assembly, a first component (the fiber 20) is first coated with a solderable thin film metallization layer 21 such as nickel (Ni), either by vacuum deposition, electrolytic or electroless process. A solder preform 22, in this case, in the shape of a sleeve or rolled up sheet is then prepared and inserted together with the metallized component into a positioning substrate 20 made up of, e.g., Kovar alloy tube (Fe—Co—Ni alloy). The positioning substrate 20 can have other shapes such as a square tube, a half tube; U-shape slot, or V-shape slot. It can be made of metals or alloys, or ceramics, e.g., $SiO_2$ (quartz), glass, or silicon or other semiconductor substrate which is properly metallized for solder bonding. The next step is to optically align the assembly and heat the solder for bonding. High speed heating is often desirable for fast manufacturing as well as to minimize the segregation of dispersoid particles and to reduce heat-induced damages to other electronic or optoelectronic components.

Instead of using a pre-fixed positioning substrate, a component such as fiber can first be solder-bonded to the positioning substrate using the dispersion-containing solder with higher melting point matrix (e.g., 95Pb-5Sn solder with a m.p. of about 300° C. or 80Au-20Sn solder with a m.p. of 278° C.). The positioning substrate with the bonded component is then optically aligned and bonded onto the platform using preferably a dispersion-containing solder with a substantially lower melting point, e.g., 52Bi-Sn eutectic (m.p.=139° C.), 37Pb-63Sn eutectic (m.p.=183° C.), Sn-3.5Ag (m.p.=215° C.) or other lower m.p. solders.

Referring back to the process of FIG. 2, in the mixing step A, an exemplary composition for the solder powder 100 is 30% to 98% by weight Pb and 2% to 70% by weight Sn. It is further possible to include up to 20% by weight of a metal such as, for example, Bi, Ag, Sb, Cu, Au, Ni, In, or Zn. The solder powder should have an average particle diameter substantially in the range of 10 $\mu$m to 1000 $\mu$m in order to provide adequate dispersion of the dispersoid particles. It is possible to determine the average diameters of solder grains and dispersoid particles by the conventional linear intercept technique used in metallography.

Solder particles having an average diameter less than 10 $\mu$m are less desirable because their large surface area tends to be susceptible to surface oxidation. Also, submicron-sized particles tend to be pyrophoric. Very fine toxic solder powders such as Pb-containing solder are also discouraged because of safety considerations in handing such powders. In contrast, the use of solder particles having diameters in excess of 1000 $\mu$m is not desirable because of the extensive plastic deformation of the solder powder required makes mixing difficult to adequately disperse the substantially smaller dispersoid particles. Therefore, it is more advantageous to employ solder powders having average particle diameters in the range of 20 $\mu$m to 200 $\mu$m.

The material for the relatively inert dispersoid particles can, for example, be stable oxides such as $TiO_2$, $ZrO_2$, $Al_2O_3$, and rare earth oxides including $Y_2O_3$, $CeO_2$, $Sm_2O_3$, $La_2O_3$ and $Dy_2O_3$. Such oxides are referred to as stable oxides because they do not substantially reduce or decompose in environments in which solder joints are formed or used. It is also possible to use lead oxides such as PbO, $PbO_2$ and $Pb_2O_3$, however, since lead oxides share a common element, Pb, with the Pb—Sn solder material, coarsening of such dispersoid material can occur. In addition, fine particles of corresponding stable nitrides such as TiN, ZrN, AlN and rare earth nitrides, or carbides such as TiC, ZrC, HfC can also be used as the dispersoid material.

The dispersoid particles impede the motion of grain boundaries such as sliding or migration and inhibit grain growth in the resulting solder composition. In order to provide such properties, the dispersoid particles should have average diameters in the approximate range of 5 nm to 5000 nm. However, the use of particles having an average diameter of at least approximately one to two orders of magnitude smaller than the average particle diameter of the solder powder facilitates advantageous coating of the surface of the solder particles with the dispersoid particles during the mixing step. Such coating further facilitates an enhanced dispersion of the particles during a subsequent plastic deformation step. Accordingly, it is advantageous to use dispersoid particles having average diameters less than approximately 100 to 500 nm to provide such advantageous dispersion for Pb—Sn solder powders. A sufficient amount of dispersoid to provide such properties for Pb—Sn solders is in the range of 0.5% to 20% of the volume of the resulting solder composition and more advantageously in the range of 1% to 10%.

In step A of FIG. 2, it is possible to mix the dispersoid particles and the solder powder by conventional dry powder mixing techniques. However, enhanced dispersing of the dispersoid particles is achievable using a wet mixing procedure. Wet mixing also reduces health and environmental risks associated with inadvertent breathing of toxic Pb-containing solder and fine dispersoid particles. Numerous liquids, such as water, can be employed for performing wet mixing. However, the use of relatively volatile liquids such as alcohol and acetone facilitate drying of the composition after mixing. It is also desirable whenever possible to use dispersoid particles which are already in the form of a suspension in a liquid, as the agglomeration of the particles during storage or handling is minimized.

In order to substantially avoid segregation of dispersoid particles from the solder material during mixing or subsequent soldering operations, it is advantageous to use dispersoid particles with a density similar to the solder material. In this manner, segregation due to floating or sing of the dispersoid particles in the solder composition due to gravity can be substantially prevented. Accordingly, it is advantageous to employ dispersoid particles having a density within 10% of the density of the solder material (90% to 110% of the solder density). To even further protect from segregation, it is desirable to use dispersoid particles and solder materials having densities that differ by no more than 5% and more desirably, by no more than 2%.

For example, it is advantageous to use a solder material such as eutectic solder alloy of approximately 37% by weight Pb and 63% by weight Sn and having a density of approximately 8.34 g/cm$^3$ with dispersoid particles of, for example, stable rare-earth oxides such as $Dy_2O_3$ or $Ho_2O_3$ having approximate densities of 8.17 g/cm$^3$ and 8.41 g/cm$^3$, respectively. Further, particular mixture ratios of rare-earth oxides can advantageously be synthesized to substantially match the density of a solder material. For instance, a mixture having a ratio of 55:45 of $Sm_2O_3$ with an approximate density of 7.62 g/cm$^3$ and $Yb_2O_3$ with an approximate density of 9.25 g/cm$^3$ produces $Sm_{1.1}Yb_{0.9}O_3$ with an approximate mixture density of 8.34 g/cm$^3$. Such mixture density substantially matches the density of the Pb—Sn eutectic solder material.

Also, since the density of various rare earth oxides range from 5.03 g/cm$^3$ for $Y_2O_3$ to 9.423 g/cm$^3$ for $Lu_2O_3$, mixtures of such oxides and/or mischmetal oxides including mixed rare earth oxides containing La, Ce and Pr, are useable for the dispersoid particles for achieving a desired density. Other oxides such as transition metal or refractory metal oxides including NbO, $ZrO_2$, $H_fO_2$, and $Ta_2O_3$ having approximate densities of 7.3, 5.8, 9.68 and 8.02 g/cm$^3$, respectively, or combinations of such oxides are also useable for providing a desired density. Alternatively, refractory metal borides, carbides or their combinations are further useable for producing dispersoid particles having a desired density including, for example, $HfB_2$, TaB, $TaB_2$, $ZrB_2$, HfC, TaC, WC, TiC, ZrC and TiC having approximate densities of 11.2, 14.0, 12.4, 6.1, 12.2, 14.7, 15.7, 6.7 and 4.25 g/cm$^3$, respectively.

Further, density matching of lead-rich solders such as conventional 95%Pb-5%Sn (wt %) solder alloy have a relatively large approximate density of 11.00 g/cm$^3$ can be accomplished using the previously listed relatively large density borides or carbides as a component for the dispersoid particles. If the melting and solidification times of the solder material are sufficiently short, then lead-containing materials are useable as a component of the dispersoid particles for achieving a desired density. Examples of such lead-containing materials include, PbO, $PbF_2$, $PbTiO_3$, $PbZrO_3$ or combinations of such lead containing materials such as Pb $(Ti_{0.46}Zr_{0.54})O_3$.

Although dispersoid particles and solder materials having matching densities substantially inhibit segregation of the particles in the resulting solder joint, it is also possible to use dispersoid particles and solder materials having different densities. However, in producing a dispersoid-containing mixture the use of liquid during wet mixing should provide a sufficient desired viscosity or inter-particle friction in the mixture to inhibit or minimize the gravity-induced segregation.

For instance, it is possible to achieve a desirable viscosity employing 10% to 40% by volume of liquid for a conventional gentle mechanical mixing process such as stirring. Relatively higher power mixing methods such as mechanical alloying using speed attrition mills or ball milling and associated plastic deformation are also useable. However, such mixing methods have relatively high processing cost and can cause agglomeration of the dispersoid or solder particles.

After wet mixing, the mixed powder aggregate is then dried to remove liquid medium. The drying process can be carried out in ambient, in an inert atmosphere such as nitrogen or argon, or in vacuum.

In step B of FIG. 2, the dried powder aggregate is plastically deformed by mechanical compression to form the dispersoid-containing solder sheet. The dispersoid-containing solder sheet has a preferred thickness in the range of 250 $\mu$m to 1 mm.

The mechanical compression step B is advantageously performed in a vacuum or inert gas environment. Such an environment reduces the amount of trapped air in such pores that undesirably cause oxidation in internal surfaces and expansion or bubbling of the gas during intermediate or final heat treatment. Also, it is possible to use hydraulic press compacting or other mechanical compression techniques.

In step B, an advantageous dispersion of the dispersoid particles is achieved by sufficient compression to produce an inter-particle distance between solder particles in the compression direction to at most ten times the average diameter of the dispersoid particles, and preferably to at most three times the dispersoid diameter. Accordingly, it is advantageous to achieve a plastic deformation of at least 50% reduction in thickness of the solder composition aggregate. Such plastic deformation advantageously reduces spacing between effective layers of dispersoid particles surrounding each flattened Pb—Sn solder particle as shown in the compression sequence of FIGS. 3B and 3C. Thus, an even greater advantage is achievable using a plastic deformation of at least 90% to 95% reduction in thickness of the solder composition aggregate. The deformation does not have to be uniaxial in nature. It could be a repeated pressing/expanding process in any direction in a manner substantially similar to, for example, the mixing of flour in dough prior to baking.

In large-scale, continuous industrial manufacturing, it is possible to use conventional metal mill processing using plates and strips for the mechanical compression. In such instance, a press-compacted preform is produced from a press-compacted dispersoid-containing solder composition aggregate. The preform is then subjected to cold or warm rolling into continuous strips which are wound into coils. Swaging into rods followed by wire drawing or roll flattening is also useable. It is optionally possible to shear the resulting plates or strips into sections that are stacked and rolled at least once to further improve dispersion of the dispersoid particles in the composition.

Figure 4:
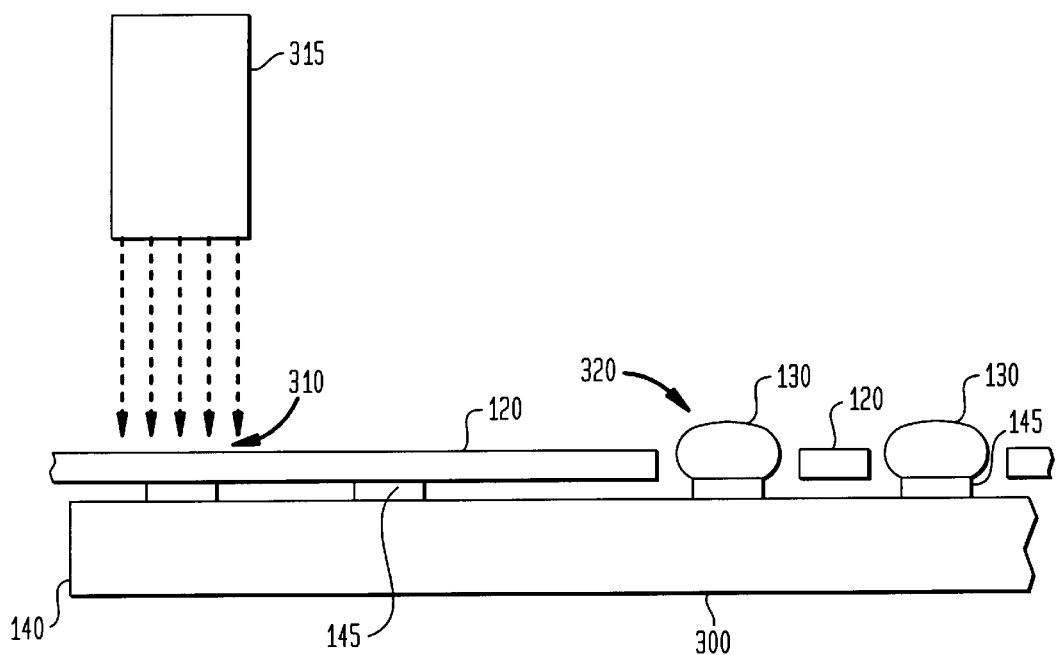
FIG. 4 is a schematic diagram illustrating an exemplary method for producing solder bumps from a dispersoid-containing solder sheet.

In step C, the dispersoid-containing solder sheet is used to form solder bumps. FIG. 4 illustrates bumps 130 being formed from a sheet 120 onto contact pads 145 of the first component 140. If the densities of the dispersoid particles and the solder material are substantially similar, then the particular method used for forming the solder bumps 130 is not critical because undesirable segregation of the dispersoid particles would not likely occur during melting. However, if densities of the dispersoid particles and the solder material are not substantially similar, then a solder bump forming method that limits segregation of the dispersoid particles should be used. Exemplary techniques that limit such segregation include the laser beam melting or pressure bonding.

The laser beam melting technique uses relatively rapid heating greater than approximately 20° C./sec and more advantageously greater than 100° C./sec and corresponding rapid cooling of more than 10° C./sec and advantageously 50° C./sec to form the solder bumps 130 substantially without segregation of the dispersoid particles. In FIG. 4, the dispersoid-containing solder sheet 120 is placed over a portion of a contact pad 145 on a substrate 300 of a first component 140. Particular regions 310 of the sheet 120 proximate each contact pad 145 are then rapidly heated using light energy from a laser 315 to melt the solder in such regions forming the solder bumps 130 as shown at the region 320. After the solder bumps 130 are formed, the remaining solder sheet 120 can be removed from the substrate 300 by, for example, mechanical or vacuum methods, and recycled for subsequent soldering operations.

To achieve enhanced wetting, a suitable solder flux such as, a rosin-mildly-activated (RMA) fluxe, is optionally applied to the contact pads 145 or the solder sheet surface contacting such contact pads prior to laser melting. The respective solder sheet regions 310 can be melted by the laser light energy sequentially or simultaneously. Further, it is advantageous to melt regions 310 that are approximately 5% to 20% larger in area than the contact pads 145 because the wetting by the contact pads 145 facilitates separation of the melted solder from the sheet 120. After formation of the solder bumps 130 on the first component 140 in step C of FIG. 2, solder joints 150 can be produced between the first component 140 and another component as by a conventional reflow process.

The solder bumps 130 are also formable from the solder sheet 120 using pressure bonding as shown in FIG. 5. In FIG. 5, the dispersoid-containing solder sheet 120 is provided over the contact pads 145. Then, at least one punch pin 350 of a pressing device 360 punches out particular regions of the solder sheet 120 that are then pressure bonded by the pin 350 to the contact pad 145 to form the solder bumps. A dashed outline 365 indicates the shape of a corresponding solder bump that would be produced on the contact pad 370 by this pressure bonding process. It is possible to form solder bumps having, for example, an average diameter in the range of 5 to 50 mils.

Ends 355 of the punch pins 350 have a shape, such as substantially concave, that facilitates pressure bonding and formation of the solder bump 130 having the desired shape. Solder non-wetting materials such as stainless steel are useable for the punch pins 350. In the alternative, the punch pin ends 355 can be coated with a solder non-wetting material, such as Teflon or a diamond film. It is advantageous to anneal the solder sheet at a temperature, for example, in the range of 0.5 $T_M$ to 0.8 $T_M$, where $T_M$ is the solder melting point temperature, prior to pressure bonding to facilitate punching, shaping and bonding of the dispersoid-containing Pb—Sn solder sheet. It is possible to anneal the solder sheet at other temperature ranges and different times based on the material of the solder sheet to achieve the desired pressure bonding characteristics.

Enhanced pressure bonding is achievable with the use of punch pins 350 having a higher temperature relative to the solder sheet 120, such as, on the order of 100° C. to 150° C. for eutectic Pb—Sn solders. Also, it is advantageous to coat the contact pads with a suitable material, such as Pb—Sn or Sn, before the pressure bonding process to facilitate adhesion of the solder bumps 130. It is also possible to coat the contact pads or the surface of the solder sheet facing such contact pads with solder flux to facilitate wetting.

Although the previously described methods produced solder joints 150 from a solder sheet 120 using powdered solder, it is alternatively possible to form the dispersoid-containing solder sheet 120 using a variety of other methods. For instance, it is possible to produce such solder compositions using a lamination-dispersion method. Such a lamination-dispersion method facilitates large scale industrial manufacturing of the dispersion-containing solder compositions and articles using such solders. Further, such a lamination-dispersion process can typically be performed at lower cost relative to solder powder processes due to the use of typically lower cost bulk solder materials instead of fine solder powders, and without the higher handing costs associated with lead-containing powders in avoiding undesirable surface oxidation and health/environmental risks.

An exemplary lamination-dispersion process is illustrated in FIG. 6. Such a process substantially performs the steps of the method of FIG. 2, but substitutes a lamination-dispersion process for the powder mixing step A. In FIG. 6, a solder sheet 200, such as a Pb—Sn solder sheet, is moved in a direction indicated by arrow 205 proximate a sprayer 210 that sprays dispersoid particles 212 of the desired material and average particle diameter on to a surface 215 of the sheet 200. The amount of the dispersoid particles coated on the solder sheet 200 should correspond to the desired volume fraction of the dispersoid in the resulting solder composition. A useable solder sheet thickness for Pb—Sn solders is, for example, on the order of 0.005 to 0.250 inches, and more advantageously in the range of 0.010 to 0.100 inches. After the solder sheet 200 is coated, it is rolled into an ingot-like preform 220 in accordance with step B of FIG. 2.

Although a single surface 215 of the sheet 200 is spray coated, it is alternatively possible to further spray coat the opposite surface 217. A conventional spray coating operation is useable for spraying the dispersoid particles in a liquid medium carrier, such as alcohol, acetone or water. It is desirable to clean the surfaces 215 and 217, mechanically or chemically, prior to dispersoid coating to remove undesirable contaminates such as grease and dirt or to remove a formed oxide skin. Such clean surfaces facilitate dispersoid-to-sheet adhesion, and sheet-to-sheet bonding.

Although a sprayer is used in FIG. 6 for coating the solder sheet 200, numerous other methods can be used to coat the sheet 200 with dispersoid particles. For example, dip coating by submerging the solder sheet 200 into a liquid medium bath containing the dispersoid particles and with or without a binder material. Also, brush painting, roller painting, electrophoretic or electrostatic attachment of wet or dry dispersoid particles are useable for coating the solder sheet 200. If a liquid medium or binder is employed during the coating process, the coated sheet should be dried prior to the subsequent mechanical compression step.

In commercial production, it is possible for the coiled preform 220 to have a weight on the order of 100–10,000 pounds and a diameter on the order of one to three feet. In the alternative, sections of the coated sheet can be cut, stacked and press bonded to form a rectangular block preform having, for example, 10 to 10,000 layers. The formed preform is then mechanically compressed in a step corresponding to step B of FIG. 2. Cold or warm rolling are useable for the mechanical compression to reduce the interlayer distance and reducing the distance between layers of the dispersoid particles. In the alternative, a plurality of smaller number of stacked or rolled layers can be employed for forming the preform 200, by repeatedly cold rolling and restacking to achieve the dispersion of the dispersoid particles. Intermediate heat treating steps, such as at a temperature of $0.5\ T_M$ to $0.9\ T_M$ for 0.1 to 100 hours facilitate interlayer bonding and mechanical softening for the compression steps.

The preform 220 is compressed to achieve a desired distribution of the dispersoid particles. The required mechanical compression is dependent on the initial solder sheet thickness, size and amount of the dispersoid particles added, and the total thickness of the multi-layer preform. For instance, a typically reduction of approximately 5% to 20% deformation in thickness per rolling pass, for compression by cold or warm rolling, is useable to achieve an overall thickness reduction of approximately 99% to 99.99%. An approximately 25 cm thick preform stack or coil including 500 layers of solder sheets, each having a thickness of about 500 $\mu$m thick and coated with 25 $\mu$m to 50 $\mu$m thick of $TiO_2$ particles having an average diameter of 100 nm (about 5% by volume) is deformable by repeated cold or warm rolling to achieve a dispersion containing solder sheet of approximately 500 $\mu$m thick. Such a deformation corresponds to a 99.8% reduction from the original 25 cm thickness.

The resulting 500 $\mu$m thick dispersoid-containing solder sheet is again stacked or coiled to a 25 cm thickness or diameter and compressed to a 500 $\mu$m thickness again to achieve an overall reduction in the distance between dispersoid particle coating layers from 500 $\mu$m to approximately 0.002 $\mu$m, which is much smaller than the average diameter of the $TiO_2$ dispersoid particles. Since a substantially uniform three-dimensional distribution of 5% by volume of 100 nm-sized dispersoid particles is an average inter-particle distance on the order of 0.3 $\mu$m, the previously described process could achieve such a substantially uniform dispersoid particle distribution.

Moreover, the relatively severe plastic deformation caused by the rolling mechanical compression exposes fresh metal surfaces enabling relatively strong solder-to-solder interlayer bonding/adhesion for compression of subsequent restacked and coiled preforms. For additional bonding and integrity of the multi-layer lamination, intermediate heat treatment including partial or rapid melting, such as, for example, by induction heating of the stacked or coiled preform is optionally useable.

Although the previously described methods for producing solder bumps with respect to FIGS. 2 to 6 used a dispersoid-containing solder sheet, such sheet is not critical for practicing the present invention. For instance, it is possible to form dispersoid-containing solder bumps by dip-coating or wave-soldering coating using a molten dispersoid-containing solder bath. It is important to maintain the desirable distribution of the dispersoid particles in the molten solder during this solder bump forming operation. Dispersoid particles having densities that substantially match the solder material are useable for this purpose. Further, agitation of the dispersoid-containing solder bath is also useable for providing the desired particle distribution whether density matching or non-matching dispersoid particles are employed. A sufficient amount agitation includes that typically used in conventional wave soldering baths.

If the densities of the dispersoid particles and the solder material are substantially different, it is desirable to provide relatively rapid cooling of more than approximately 10° C./sec and more advantageously 50° C./sec during dip-coating or wave-soldering coating to substantially inhibit segregation of dispersoid particles in the formation of the solder bumps 130.

Figure 7A:
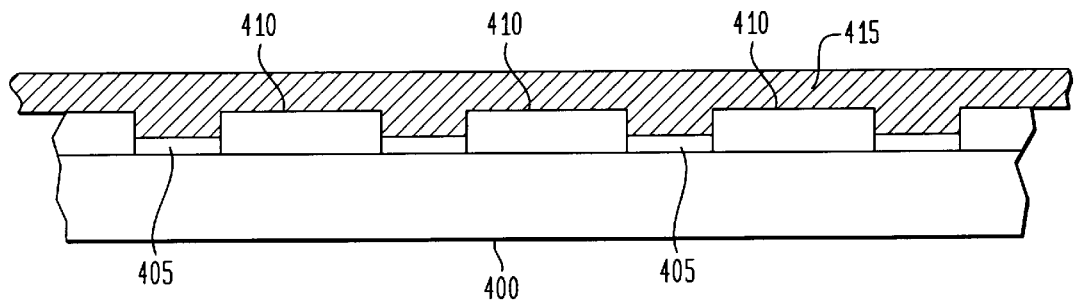
FIGS. 7A and 7B are schematic diagrams of another method for forming dispersoid-containing solder bumps.
Figure 7B:
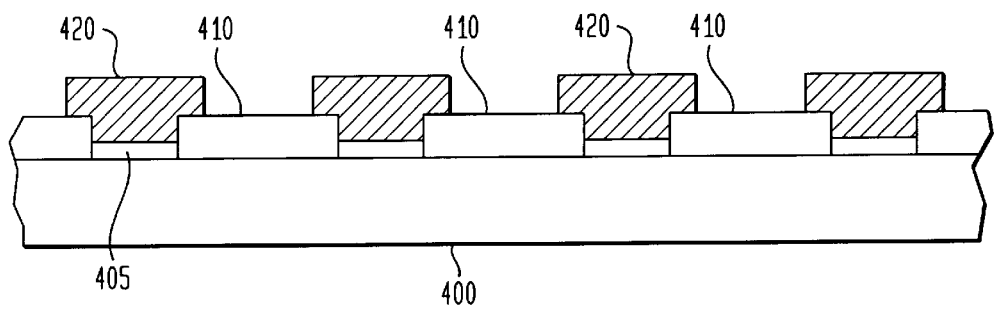

In the alternative it is possible to produce solder bumps covering areas of a component on the order of 2500 $\mu m^2$ or less using deposition of a thin film dispersoid-containing solder layer and photolithographic removal. FIGS. 7A and 7B illustrate exemplary steps in accordance with this method.

In FIG. 7A, contact pads 405, such as copper or aluminum contact pads, are formed on a surface of a substrate 400, such as a silicon substrate. Those areas of the silicon substrate surface not containing contact pads are covered with a protective insulator 410 such as, for example, polyimide or an oxide layer, that does not wet a molten solder. Then, the contact pads 405 and insulator layer 410 are coated with a dispersoid-containing solder mixture having the desired compositional ratio to form layer 415. It is possible for the thickness of the solder film layer 415 to be in the approximate range of 0.1 $\mu m$ to 50 $\mu m$ and more advantageously in the range 0.1 $\mu m$ to 2 $\mu m$.

It is possible to accomplish such coating by co-sputtering from Pb—Sn and dispersoid targets or a combination of sputtering and evaporation of such materials. If an electrical insulator, such as oxide, boride or carbide, is used for the dispersoid, then RF sputtering rather than DC sputtering is useable for depositing such material. Further, if the dispersoid is an oxide, then it is possible to employ a residual oxygen gas in the deposition chamber atmosphere to produce the desired oxide during the deposition process.

After the formation of the solder layer 415, portions of the layer 415 not proximate the contact pads 405 are removed as by etching using a conventional lithography process to form regions 420 of the solder film layer 415 proximate the contact pads 405, (see FIG. 7B). The mating device is then placed on top and solder bonding can be carried out by heating. Alternatively, for better control of solder bonding area, the substrate 400 and its layers can be heated to reflow the solder layer and produce micro-solder bumps prior to the final soldering assembly.

Since conventional lithographic material removal techniques are useable for producing a micron-level resolution, high-density, micron-size solder bumps 425 are formable. Although this technique is useable for forming solder bumps covering a component area of approximately 2500 $\mu m^2$ or less, it is particularly advantageous for forming solder bumps covering component areas of approximately 25 $\mu m^2$ or less, and even more advantageously 4 $\mu m^2$ or less.

It is also possible to produce the advantageous dispersoid-containing solder joints of the invention using a solder paste technique instead of solder bumps. Such solder pastes include the dispersoid-containing solder particles mixed with suitable fluxes and other chemicals. Is possible to form such solder pastes on a component for producing solder joints using conventional techniques employed with surface mount components including screen printing of the solder paste. After the paste is formed on a component, a mating component is properly aligned and positioned in contact with the solder paste, and a corresponding solder joint is formed by heating the components to reflow the solder.

It is possible to produce the dispersoid-containing solder powder material contained within the solder paste by mechanical scraping of alloy from solid, dispersoid-containing alloy blocks, followed by remelting and solidification of the scraped material suspended in a fluidized medium. In the alternative approach, a dispersoid-containing molten solder is atomizable to produce the dispersoid-containing solder powder.

FIG. 8 illustrates the formation of dispersoid-containing solder joints 150 between contact pads 145 of first and second components 140 and 500. Such solder joints advantageously maintain a sub-micron grain size that enhances the fatigue life of the solder joint due to thermal and stress cycling by exhibiting a level of superplasticity. Spacers 520 limit the extent of deformation due to compression force applied to either of the components 140 and 500. Accordingly, an undesirable over-spreading of the solder joint 150 due to its superplasticity is advantageously restrained. In a similar manner, lateral or tensile deformation can be restrained by using a pin-in-a-hole configuration. In such a configuration, a pin or protrusion attached to one of the components extends into a hole in the other component. Such a configuration limits the lateral movement of the components relative to one another as the pins relative movement is limited by the component surfaces forming the hole.

In the following examples, dispersoid-containing solders are formed having an advantageously fine average solder grain diameter of 5 nm to 2000 nm to achieve a level of superplasticity providing an improved solder joint strength of at least 30% to 50% relative to a corresponding composition without dispersoid particles and a corresponding improvement of fatigue life of at least 50% to 100%.

EXAMPLE 1

A mixture of Pb—Sn eutectic solder powder having an average particle diameter of approximately 50 $\mu m$ was wet mixed with $Al_2O_3$ dispersoid particles having an average particle diameter of 10 nm using ethyl alcohol. The $Al_2O_3$ dispersoid particles made up approximately 2% by volume of the mixture. The composite was dried, pressed for consolidation, annealed at 120° C., and repeatedly plastically deformed and annealed to achieve an overall reduction in thickness of greater than $\frac{1}{10}^4$. The resulting solder sheet was then annealed at 120° C. for 3 hours and 48 hours, respectively, to produce the microstructures shown in FIGS. 9A and 9B. The 120° C. corresponds to a high homologous temperature of 0.86 $T_m$, wherein the melting temperature of the eutectic Pb—Sn solder is 183° C.

Figure 10:
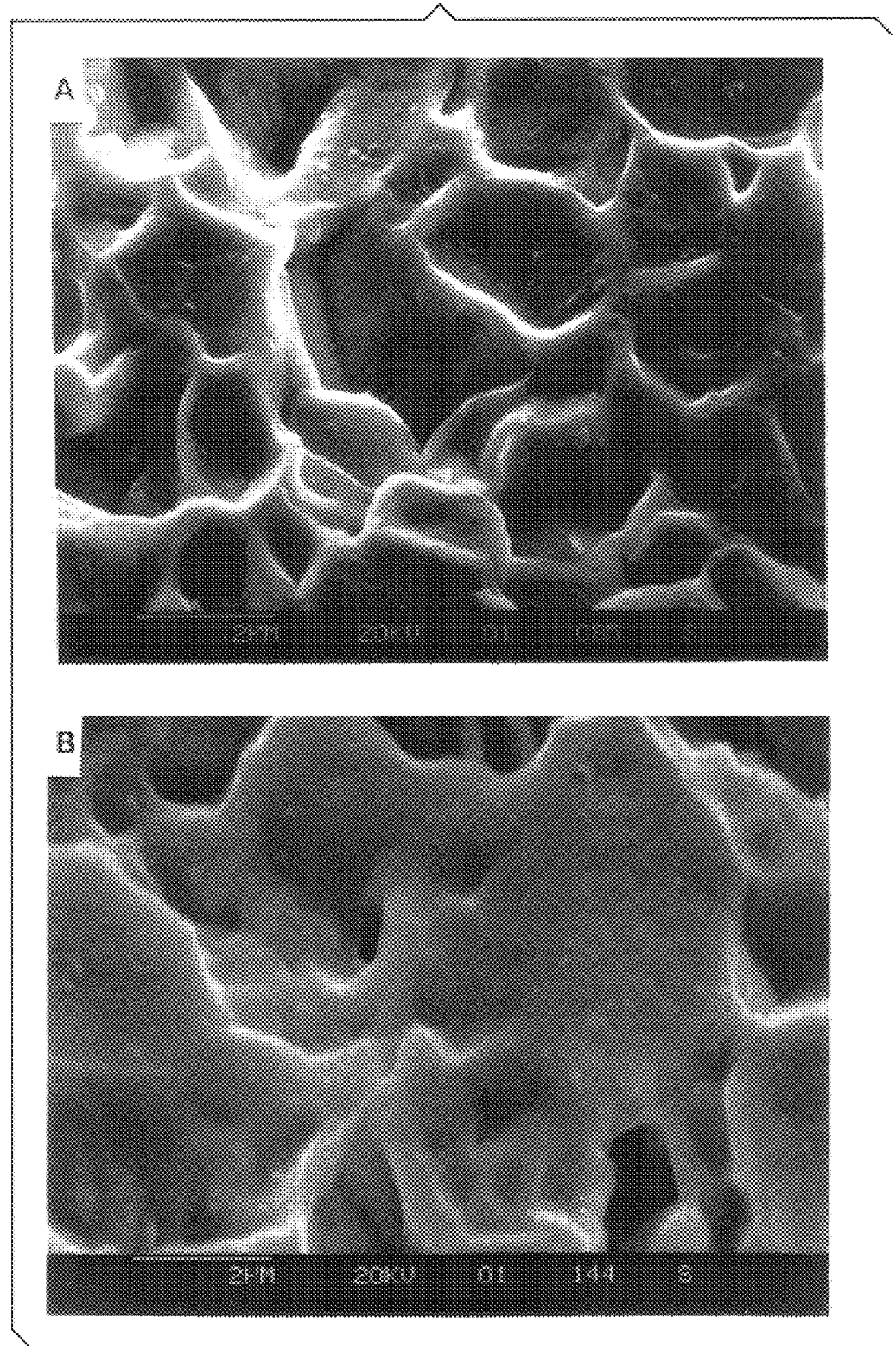
FIGS. 10A and 10B are micrographs of conventional solder alloys.

In FIG. 9A, after the annealing at 120° C. for 3 hours, the average grain diameter is approximately 200 nm using a linear intercept technique. The average grain diameter after annealing at 120° C. for 48 hours is advantageously approximately the same 200 nm. In comparison, the same annealing at 120° C. for 3 and 48 hours was applied to a corresponding Pb—Sn sheet without dispersoid particles which produced the microstructures shown in FIGS. 10A and 10B, respectively. The microstructure shown in FIG. 10A possesses an average grain diameter of approximately 2 $\mu m$ which disadvantageously coarsens to 5 to 6 $\mu m$ after 48 hours of annealing, as shown in FIG. 10B.

Figure 11:
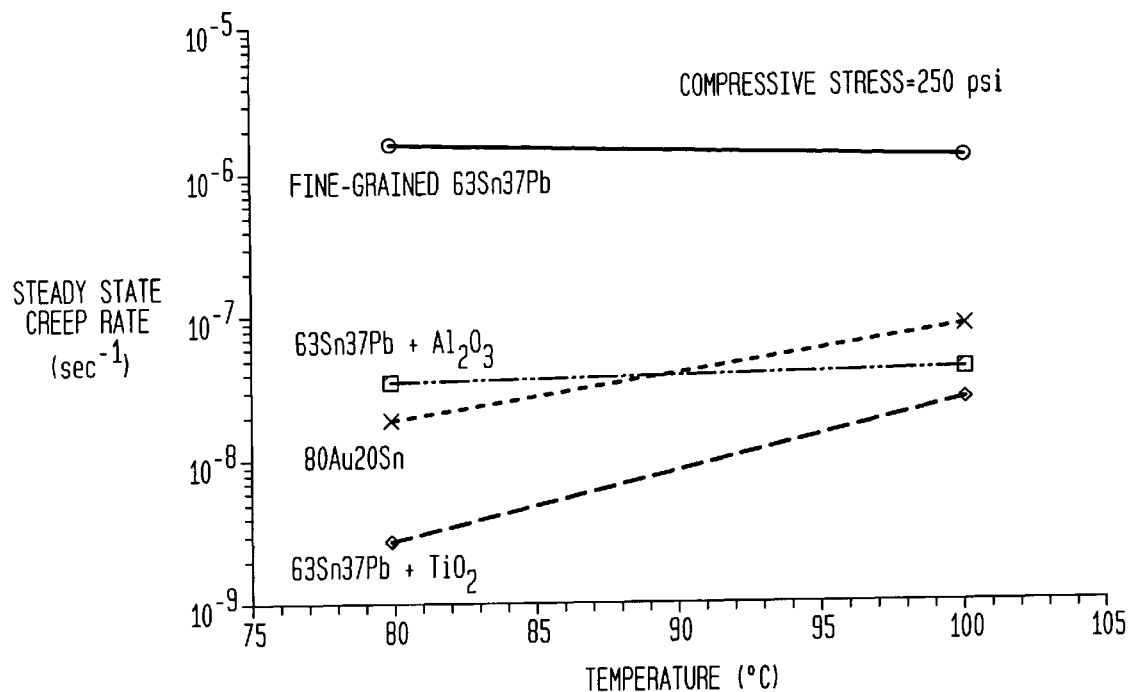
FIG. 11 shows comparative creep rates of the inventive solders and the prior art solders.

Similarly processed 63Sn-37Pb samples with 3% by volume of 10 nm sized $Al_2O_3$ particles or 3% by volume of 5 nm sized $TiO_2$ particles were tested for creep resistance and mechanical strength and compared with those of the samples without the dispersoid particles. As shown in FIG. 11, the dispersoid-containing Pb—Sn solders according to the invention exhibit much less rate of creep deformation than the prior art Pb—Sn solder processed similarly, by about 2–3 orders of magnitude. The inventive solders, even with their melting point (183° C.) almost 100° C. below that for 80Au-20Sn eutectic (m.p. =278° C.), have the steady state creep rate comparable to or better (in the case of $TiO_2$ dispersoid) than that for the Au—Sn solder. The dispersoid-containing solders according to the invention typically exhibit a steady state creep rate reduced by a factor of at least 2, preferably by at least 10, even more preferably by at least 50.

Figure 12:
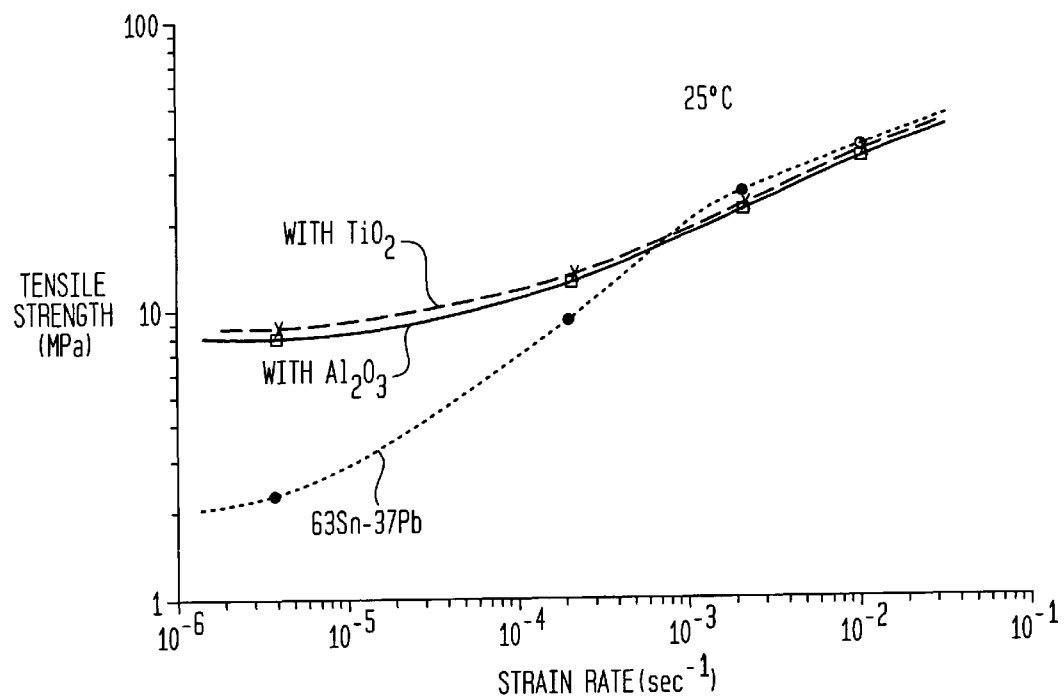
FIG. 12 describes the comparative tensile strengths of the inventive solders and the prior art solder.

Shown in FIG. 12 are the comparative tensile strengths of the dispersoid-containing solders vs that of the prior art solder without dispersoid. It is evident that the presence of the dispersoid particles significantly increases the strength of the solder at typical strain rates of interest for creep, i.e., less than $10^{-4}$/second. It is believed that such strengthening of solder, at least partly contributes to the observed creep resistance. The inventive solders typically have improved tensile strengths compared to the prior art solder without dispersoid, by at least 50%, preferably by at least 200%.

EXAMPLE 2

Another solder alloy according to the invention was similarly prepared and processed as in EXAMPLE 1 except dispersoid particles of $Al_2O_3$ having an average diameter of approximately 200 nm were used. A corresponding resulting advantageous average grain diameter of 500 nm and 600 nm were produced by annealing at 120° C. for 2 and 48 hours, respectively. Such fine grain diameters represent a substantial improvement over the grain diameters of the conventional Pb—Sn solder alloy shown in FIGS. 10A and 10B.

Instead of dispersoid-containing solders, dispersoid-containing adhesive materials such as epoxies can be used for optoelectronic assembly according to the present invention. For example, 0.1–20% by volume, preferably 0.5–5% by volume, of the nano-sized (5–2000 nm) particles of oxides (such as $Al_2O_3$, $TiO_2$, $La_2O_3$), nitrides (such as AlN, TiN, ZrN) or carbides (such as TiC, ZrC, HfC) can be mixed with an epoxy, applied to the interface to be bonded, and then cured by heat or UV light. Finer particle size of the dispersoid, e.g. below ~500 nm, is preferable to minimize their gravity induced segregation in the epoxy matrix before curing. The epoxy can be either a single component or a two-component system. A relatively high $T_g$ (glass transition temperature) of the matrix epoxy material is desired to minimize the creep. The presence of the ultrafine, dispersoid particles impede the flow of the epoxy and reduces the creep rate in the joint. The presence of submicron to nano-scale dispersoid particles advantageously increases the viscosity of the epoxy matrix and reduces the gravity-induced segregation of the particles before curing.

The dispersoid-containing solders or adhesives according to the invention are useful, in addition to the simple optical assemblies shown in FIGS. 1A and 1B, and for a variety of other optoelectronic packaging applications.

Figure 13:
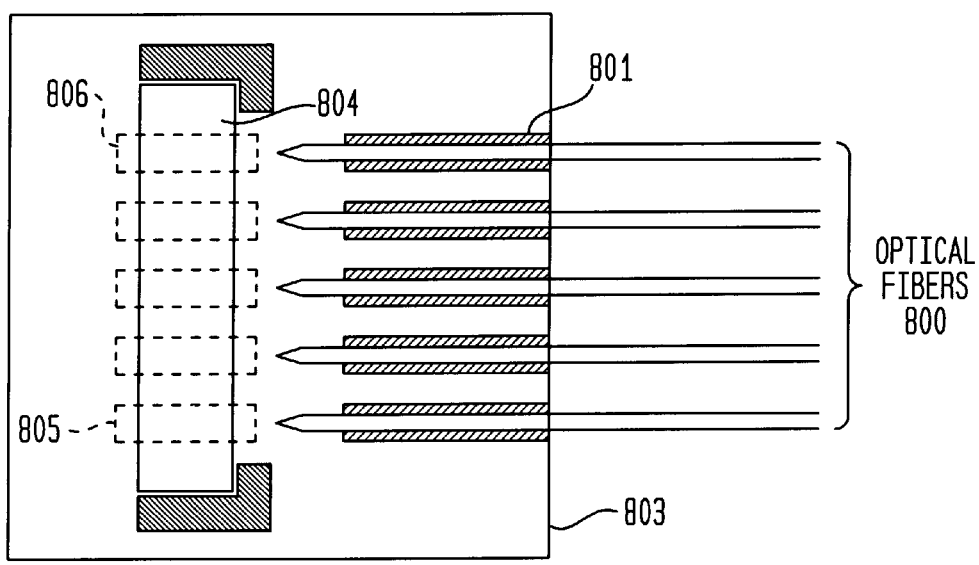
FIG. 13 schematically illustrates an exemplary optical assembly.

FIG. 13 illustrates an optical assembly using silicon waferboard technology (silicon bench technology). Here, a multiplicity of optical fibers 800 are placed in precision etched V-grooves 801 in a silicon wafer 803, and are bonded with the inventive, creep resistant solders or adhesives. Either the fiber surface, the V-grooves, or both may be metallized for ease of soldering. The creep resistant bonding material can be added either as a solid preform (e.g., solder preform) as a solder paste, or as a liquid, uncured adhesive, in the groove or above the placed fiber. The soldering or adhesive curing operation can be performed while the fibers are mechanically compressed, for example, with a compliant but non-solderable stainless steel or aluminum clips, fingers, or mesh screen sponge. The laser array chip 804 comprising a multitude of lasers 805 is optically aligned with the fibers, either actively using in-situ light monitoring or passively using mechanical alignment features such as precisely etch-patterned sideway pedestals and/or underlying stand-offs in the silicon wafer board, and then bonded onto the contact pads by solder bonds 806. The laser array chips may also have metallizations on the contacts to promote reliable solder bonding. Alternatively, the laser chip can be bonded first followed by alignment and bonding of the fibers.

Figure 14:
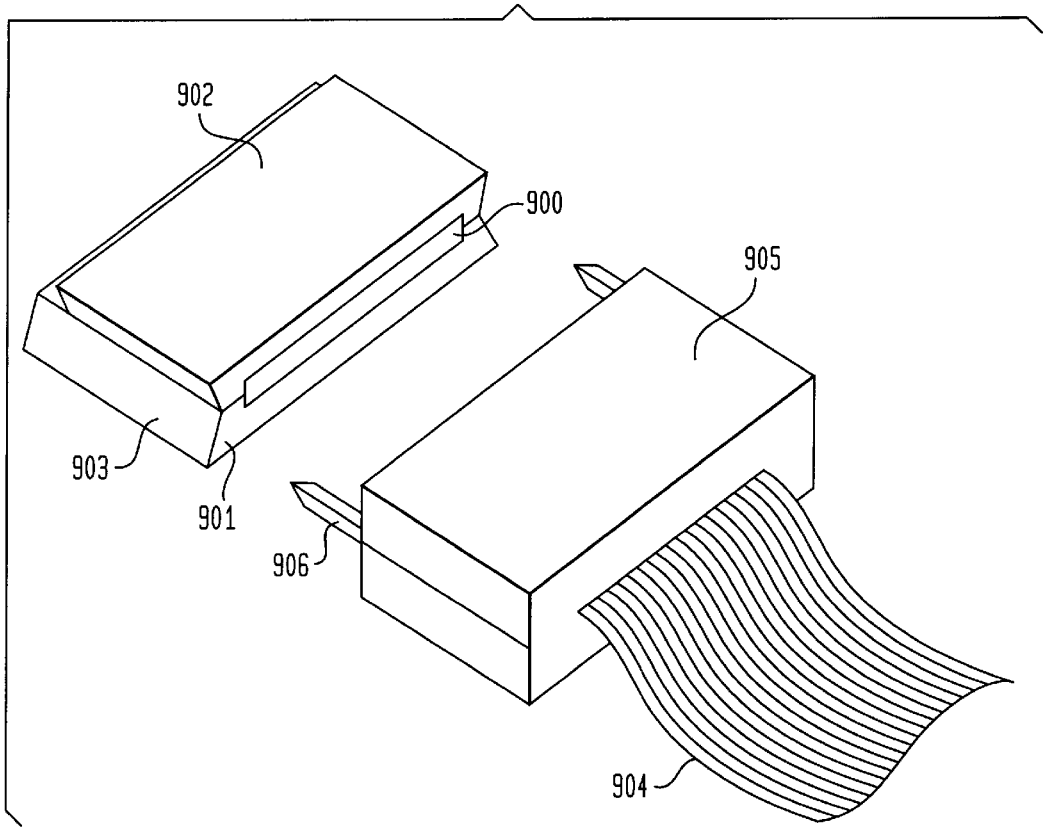
FIG. 14 is another exemplary embodiment of optical assembly comprising a multitude of lasers and a fiber ribbon.

FIG. 14 is a multiple-fiber connector assembly for an optical data link comprising a laser array chip 900 bonded between a silicon submount 901 and a silicon cap 902. The submount and cap have oblique lateral edges to define alignment V-grooves 903. A corresponding array of fibers (not shown) from a fiber ribbon 904 is mounted in a plug 905 with alignment pins 906 for mating against the V-grooves 903. The optical alignment of the fibers to the laser array 900 and permanent fixturing is achieved by inserting (or sliding) the alignment pins 906 into the alignment V-grooves 903 (preferably metallized for solderability) and solder bonding the pins onto the grooves.

Figure 15:
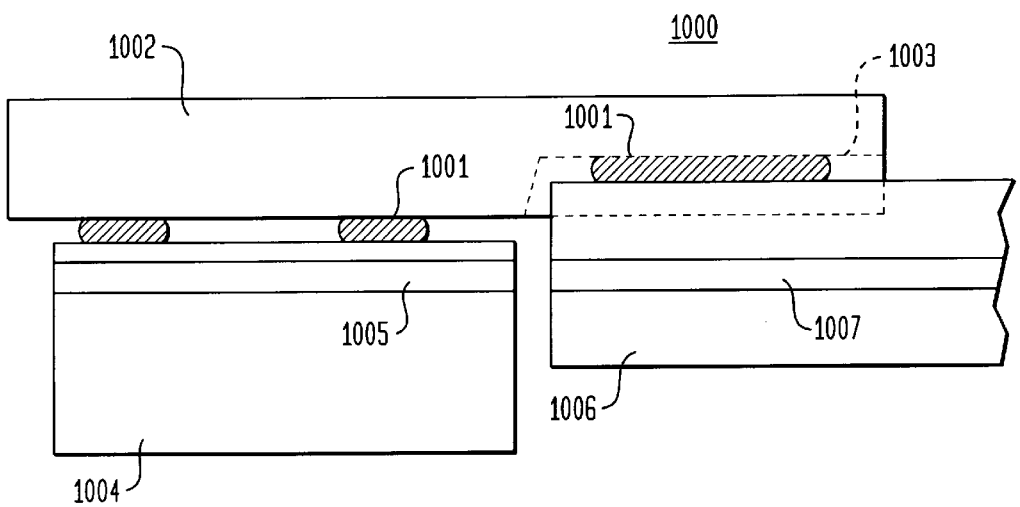
FIG. 15 illustrates an optical assembly comprising an integrated optical waveguide and fiber.

FIG. 15 schematically illustrates an optical assembly comprising an integrated optical device 1000 made with bonds 1001 of the creep resistant solder or adhesive. The device typically includes a silicon wafer board 1002 which can include alignment V-grooves 1003, an integrated optical device 1004 which can include at least one waveguide 1005 and at least one optical fiber 1006 with its core 1007 aligned by the V-groove to the waveguide 1005.

Figure 16:
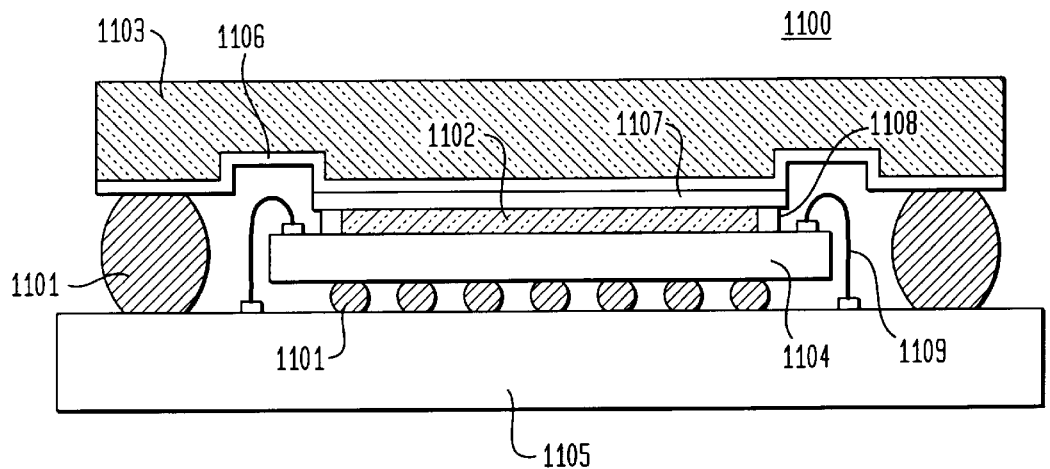
FIG. 16 describes an exemplary optical assembly comprising a spatial light modulator according to the invention.

FIG. 16 schematically illustrates an optical assembly comprising an optical modulator 1100 made with bonds 1101 of creep resistant solder or adhesive. In essence, a ferroelectric liquid crystal 1102 is disposed between a glass cover 1103 and a VLSI circuit 1104, and the cover 1103 and circuit 1104 are bonded to a substrate 1105. The glass is typically coated with indium-tin-oxide (ITO) 1106, and an alignment layer 1107 and spacers 1108 are provided. The circuit 1104 is connected to conductors on the substrate 1105 as by wire bonds 1109.

Figure 17:
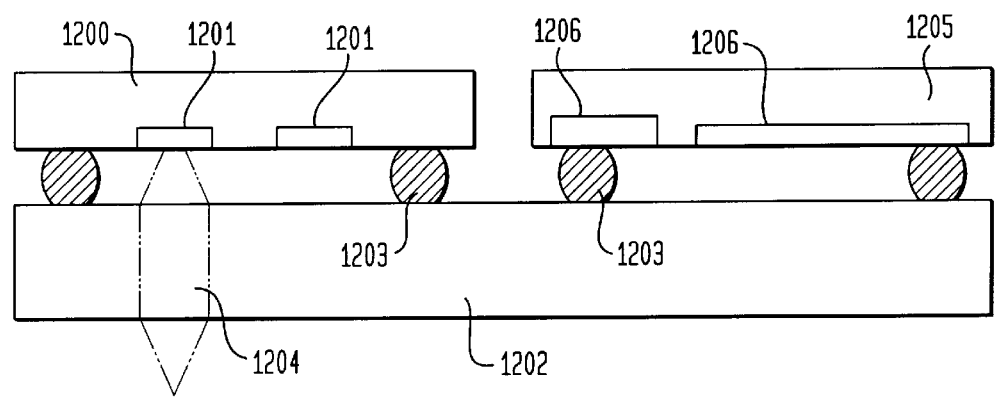
FIG. 17 illustrates an optical assembly comprising a combined optoelectronic and electronic assembly.

FIG. 17 illustrates an optical assembly comprising an array chip 1200 of vertical-cavity surface emitting lasers 1201 bonded to a micro-optics chip 1202 with bonds 1203 of creep resistant solder or adhesive. The micro-optics chip can include an array of microlenses 1204 aligned with the lasers 1201, and a microelectronics chip 1205 containing logic and driver circuits 1206 can also be bonded to the micro-optics chip 1202.

Figure 18:
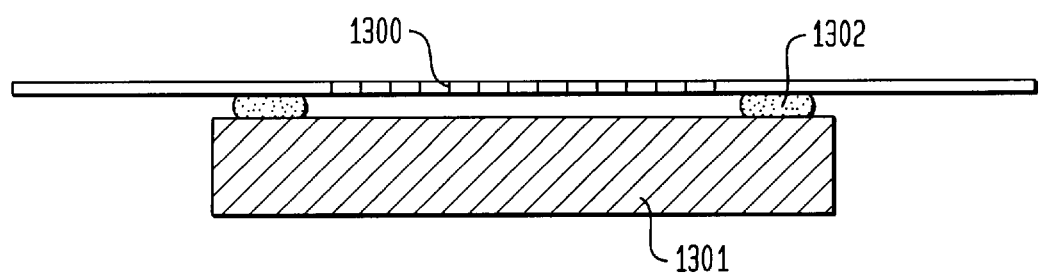
FIG. 18 schematically illustrates an optical assembly comprising optical fiber gratings and temperature compensating bodies.

FIG. 18 schematically illustrates an optical assembly comprising an optical fiber grating 1300 secured to a temperature compensating body 1301 with bonds 1302 of creep resistant solder or adhesive. The temperature compensating body is a material or composite structure with a negative coefficient of thermal expansion for relaxing elastic strain on the fiber grating upon temperature rise. Some examples of the negative CTE materials or structure are Zr-tungstates (see an article by Mary et al., Science, vol. 272, p. 90 (1996)), Ni—Ti alloys with near room-temperature phase transitions.

Although several embodiments of the invention have been described in detail above, many modifications can be made without departing from the teaching thereof. All of such modifications are intended to be encompassed within the following claims. For example, many other designs of optical assembly can be made dimensionally stable by using the inventive creep resistant materials. Also, although the previously described embodiments concern the use of Pb—Sn solder alloys, it should be readily understood that adhesives, such as epoxies, or lead-free solders such as, for example, Sn—Ag, Sn—Sb, Bi—Sn and Sn—In, In—Ag based solders are useable to form dispersoid-containing bonded joints in accordance with the invention.

What is claimed:

1. An optical assembly comprising at least one optical element and at least one support element, said optical element bonded to said support element with a bonding material comprising at least 0.5% by volume of non-magnetic dispersoid particles insoluble in said bonding material, said particles having an average size less than about 5000 nm for providing said bonding material with an improved creep resistance having a steady state creep rate of at most 50% of the creep rate of the bonding material without said dispersoid particles.

2. The optical assembly of claim 1 wherein said bonding material has a steady state creep rate at most 10% of the creep rate of the bonding material without said dispersoid particles.

3. The optical assembly of claim 1 wherein said bonding material is solder.

4. The optical assembly of claim 1 wherein said bonding material is epoxy.

5. The optical assembly of claim 1 wherein said optical element is an active optical element.

6. The optical assembly of claim 1 wherein said optical element is an active optical element chosen from the group consisting of lasers, light-emitting diodes, photodetectors, and liquid crystal devices.

7. The optical assembly of claim 1 wherein said optical element is an optical waveguide.

8. The optical assembly of claim 1 wherein said optical element is an optical fiber.

9. The optical assembly of claim 1 wherein said support element comprises a V-shaped groove for aligning said optical element.

10. The optical assembly of claim 1 wherein said bonding material is a solder chosen from the group of solder families consisting of Pb—Sn, Sn—Ag, Bi—Sn, Au—Sn, Sn—Sb, Sn—In and In—Ag.

11. The optical assembly of claim 1 wherein said particles comprise particles chosen from the group consisting of oxides, nitrides, carbides and borides.

12. The optical assembly of claim 1 wherein said particles comprise a volume in said bonding material in the range of 0.5%–20%.

13. The optical assembly of claim 1 wherein said particles comprise a volume in said bonding material in the range of 1%–10%.

14. The optical assembly of claim 1 wherein said bonding material is low melting temperature solder.

15. The optical assembly of claim 1 wherein said particles comprise particles chosen from the group consisting of $TiO_2$, $ZrO_2$, and $Al_2O_3$.

16. The optical assembly of claim 1 wherein said particles comprise particles chosen from the group consisting of $Y_2O_3$, $CeO_2$, $Sm_2O_3$, $La_2O_3$, and $Dy_2O_3$.

17. The optical assembly of claim 1 wherein said particles have an average density in the range 90%–110% of the average density of the bonding material.

18. A method of interconnecting first and second components, at least one of the components being an optical component, comprising the steps of: disposing a dispersoid-containing solder between the said first and second components, at least a portion of said solder material having an average grain diameter of no more than 10,000 nm, and said dispersoid comprising non-magnetic particles which are substantially inert relative to said solder material and which have an average diameter in the range of 5 nm to 5000 nm; and forming dispersoid-containing solder joints between said components with creep rate of the joint being at most 50% of the solder without the dispersoid.

19. The method of claim 18 wherein forming said joints comprises forming solder bumps on a surface of said first component from a solder sheet; positioning said second component in a desired orientation relative to said first component; and reflowing the solder bumps to form solder joints interconnecting said components.

20. The method of claim 19 wherein said step of forming the solder bumps further comprises: heating regions of the solder sheet using light energy to melt such regions and to deposit corresponding molten dispersoid-containing solder material at locations of said solder bumps on said first component; and cooling said molten dispersoid-containing solder material to form said solder bumps.

21. The method of claim 19 wherein forming said solder bumps further comprises: punching regions of the solder sheet at desired locations for said solder bumps; and applying sufficient pressure to said punched solder material regions to bond said material regions to said first component.

22. The method of claim 21 further comprising annealing said solder sheet at a temperature in the range of 0.5 $T_M$ to 0.8 $T_M$ prior to the punching step, wherein $T_M$ is the melting point temperature of the solder material.

23. The method of claim 21 further comprising coating regions of the first component with a component of said solder material prior to applying pressure.

24. The method of claim 21 further comprising coating regions of the first component with a component of said solder material prior to the step of applying pressure to facilitate adhesion of the solder bump.

25. The method of claim 18 further comprising applying flux to regions of the solder prior to forming said joints.

26. The method of claim 18 further comprising providing a spacer between the first and second components to control thickness of the solder joint.

* * * * *